US005355080A

United States Patent [19]

Sato et al.

[11] Patent Number: 5,355,080

[45] Date of Patent: Oct. 11, 1994

[54] MULTI-POINT PROBE ASSEMBLY FOR TESTING ELECTRONIC DEVICE

[75] Inventors: Kaoru Sato, Tokyo; Yutaka Okumura, Kanagawa, both of Japan

[73] Assignee: Giga Probe, Inc., Kanagawa, Japan

[21] Appl. No.: 153,499

[22] Filed: Nov. 17, 1993

Related U.S. Application Data

[63] Continuation of Ser. No. 563,306, Aug. 6, 1990, abandoned.

[30] Foreign Application Priority Data

Aug. 7, 1989 [JP] Japan .................................. 1-204122

[51] Int. Cl.[5] ......................... G01R 1/06; G01R 31/02

[52] U.S. Cl. .................................. 324/761; 324/158.1

[58] Field of Search ............... 324/158 P, 158 F, 72.5, 324/149; 439/482

[56] References Cited

U.S. PATENT DOCUMENTS

| | | | |
|---|---|---|---|
| 3,613,001 | 10/1971 | Hostetter | 324/158 P |
| 4,001,685 | 1/1977 | Roch | 324/158 P |
| 4,035,723 | 7/1977 | Kvaternik | 324/158 P |
| 4,599,559 | 7/1986 | Evans | 324/158 P |
| 4,812,745 | 3/1989 | Kern | 324/158 P |
| 4,965,865 | 10/1990 | Trenary | 324/158 P |
| 5,049,813 | 9/1991 | Van Loan et al. | 324/158 F |

FOREIGN PATENT DOCUMENTS

| | | | |
|---|---|---|---|
| 54-43354 | 12/1979 | Japan . | |
| 0013742 | 2/1981 | Japan | 324/158 P |

*Primary Examiner*—Vinh Nguyen

*Attorney, Agent, or Firm*—Lowe, Price, LeBlanc & Becker

[57] ABSTRACT

Probe pins are mounted on a housing in a manner which deflects the same and induces a preload therein. Upon the pins being brought into contact with a surface, the preload immediately increases the amount of contact pressure which is developed for a given amount of overdrive. In one embodiment the probe pin has both ends secured to the housing. A V-shaped portion is formed in the pin and used as the contact point. The manner in which the probe is secured, bends a portion of the pin proximate the contact point and produces a preload. As the other end is also secured, the preloading is augmented and contact point is prevented from undergoing lateral movement away from the housing on which it is secured.

2 Claims, 5 Drawing Sheets

MULTI-POINT PROBE ASSEMBLY FOR TESTING ELECTRONIC DEVICE

This application is a continuation of application Ser. No. 07/563,306 filed Aug. 6, 1990, now abandoned.

BACKGROUND OF THE INVENTION

1. Field of the Invention

The present invention relates generally to a multi-point probe assembly for testing electronic devices such as an integrated circuit, a flat panel display or the like. More specifically, the present invention relates to a multi-point probe assembly which is easy to assemble with the contact pressure variations between probe arms maintained essentially uniform and (b) this essentially uniform contact pressure can be retained even after the long use of the assembly.

2. Description of the Prior Art

Various types of multi-point test probe assemblies have been developed hitherto for testing electronic devices of the above mentioned type. One example of such a device is disclosed in Japanese Patent Publication No. 54-43354 (corresponding to U.S. application Ser. No. 799,472 filed Feb. 14, 1969).

This prior art test probe assembly, illustrated in FIGS. 1 and 2, is equipped with a plurality of needle-like probe arms or probe pins 2. It should be noted that throughout the instant specification each of the term "probe arm" and "pin" has an identical meaning. Each of these arms 2 has a radially outboard end portion, and an intermediate portion which is supported by a combination of a circularly shaped supporting member 4 and a circularly shaped holding member 5 positioned on one of two main surfaces of the printed board 1. The holding member 5 is formed of an insulating, thermosetting material. As shown in FIG. 1, the probe arms 2 are arranged in an essentially conical formation and at predetermined angular intervals with respect to the center of the printed board 1.

The radially outer end portions of the probe arms 2 are connected to printed lines 6 formed on one surface of the printed board 1 by means of soldering (7). These printed lines 6 extend into through-holes 8 and are connected with pins (terminals) (not shown) of an external electronic-device test system, which are received therein.

The inboard end portions of the probe arms 2 protrude into the space formed inside the holding member 5 in a manner such that probe-points 3 formed at the inboard ends of the probe arms are accurately positioned on a given plane below the lower surface of the holding member 5.

During testing of an electronic device (not shown), the probe points 3 are respectively brought into contact with terminals of the electronic device in a manner which establishes electrical connections with the device under test.

However, this arrangement has suffered from the drawback that the contact pressure with which the probe points 3 are brought into contact with the terminals of the device under test, is not uniform. The reason for this is that the lengths of the probe arms differ due to the radial arrangement of the same.

Further, the Young's modulus of the thermosetting material (e.g. epoxy resin) from which the holding member 5 is formed, is small as compared with that of the probe arm. Therefore, it is very difficult that the holding member 5 fixedly holds the very small deviations of the probe arm 2. It follows that, depending on the amount of contact pressure which is applied, the probe arm 2 is undersirably allowed to be slightly deviated. In such an instance, the point at which each of the probe arms is actually supported, moves toward the soldered point 7. As a result, depending on the amount of overdrive of each of the probe arms 2, the initially arranged position of each of the probe points 3 tends to deviate as the assembly is used or with the passing of time. This accentuates the problem that the contact pressure between the probe arms 2 is not uniform.

Still further, in the case of the arrangement shown in FIGS. 1 and 2, the probe arms 2 are not subject to any downwardly acting bias. Therefore, in order to achieve a relatively good level of contact pressure, it is necessary to increase the strength of the probe arm by either increasing the diameter of the same or using a hard, relatively expensive material such as Tungsten or the like. However, increasing the thickness or diameter of the probe arm inherently limits the pitch at which the probe arms can be arranged.

SUMMARY OF THE INVENTION

It is therefore an object of the present invention to provide a test probe assembly which improves the uniformity and level of the contact pressure which is generated.

It is a further object of the present invention to provide a test probe assembly which allows testing of an electronic device with a large number of terminals, and obviates the chance of scratching or otherwise damaging the terminals of the device under test.

It is a further object of the present invention to provide a test probe assembly which has more than 100 probe arms or pins arranged at 10 μm intervals and which is easy to assemble and which exhibits a low deviation in pin to pin contact pressure.

In brief, the above objects are achieved by an arrangement wherein probe pins are mounted on a housing in a manner which deflects the same and induces a preload therein. Upon the pins being brought into contact with a surface, the preload immediately increases the amount of contact pressure which is developed for a given amount of overdrive. In one embodiment the probe pin has both ends secured to the housing. A V-shaped portion is formed in the pin and used as the contact point. The manner in which the probe is secured, bends a portion of the pin proximate the contact point and produces a preload. As the other end is also secured, the preloading is augmented and contact point prevented from undergoing lateral movement away from the housing on which the pin is secured. By overdriving the pins to the point wherein the critical stress of the same is approached, the pin to pin contact pressure deviation tends to minimize.

More specifically, a first aspect of the present invention comes in a multi-point test probe assembly which features a body; a pin, the pin having a first end fixedly secured to the body and a second end which includes a contact portion to be brought into contact with a test surface; and a support, the support engaging a portion of the pin which is not fixedly secured to the body in a manner which deflects the same and induces a preload, the preload biasing the contact portion in a direction opposite to a direction along which the pin is brought into contact with the test surface.

A second aspect of the present invention comes in a multi-point test probe assembly which features: a body; a pin, the pin having first and second ends, the first and second ends being fixedly secured to the body, the pin being formed with a contact portion intermediate of the first and second ends which can be brought into contact with a test surface; and a support, the support engaging a portion of the pin in a manner which deflects the same and induces a preload which acts on the contact portion and which tends to bias the contact portion into contact with the test surface and therefore increase the contact pressure generated upon the contact point being brought into contact with a surface.

BRIEF DESCRIPTION OF THE DRAWINGS

The object and features of the present invention will become more readily apparent from the following detailed description of the preferred embodiments taken in conjunction with the accompanying drawings in which.

DETAILED DESCRIPTION OF THE INVENTION

Figure 3:
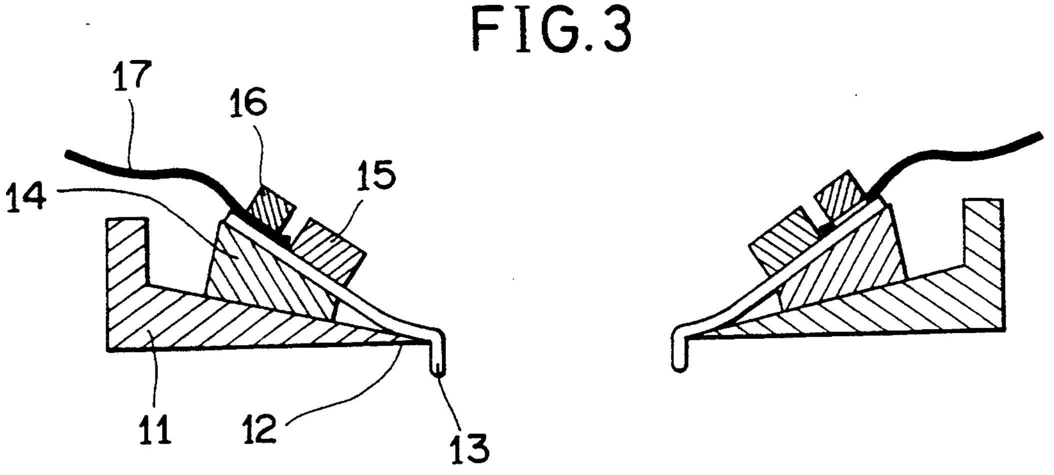
FIG. 3 is a sectional view showing a first embodiment of the present invention.
Figure 4:
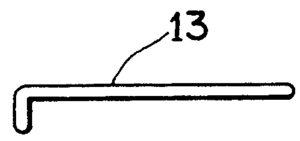
FIG. 4 shows the configuration of a pin used in the first embodiment of the present invention, which assumes prior to assembly of the unit.

FIG. 3 shows a first embodiment of the present invention, while FIG. 4 shows the original configuration of a pin prior assembly. In this arrangement, an alumina ceramic pin support 14, provided on an alumina ceramic base 11, is arranged to support a plurality of pins 13 (only one is shown). In this instance the pins 13 are arranged at a pitch of 100 μm and are secured on the upper surface of a wedge shaped portion of the pin supporting block 14 by pin retaining clamp 15. The upper ends of the pins 13 are connected to an FPC (flexible printed circuit) 17 by way of an FPC clamp 16.

As shown, in the assembled state each of the pins 13 is arranged to have a leading and portion pressed down against a leading edge portion 12 of a tapered or wedged shaped portion of the housing base 11 in a manner which elastically deforms or deflects (partially bends) and imparts a preloading on the same. Viz., as will be appreciated, the original configuration shown in FIG. 4, is subject to elastic deformation in a manner wherein, almost from the very instant the pin 13 is brought into contact with a surface of a terminal of a device under test, sufficient force is applied to ensure that a good contact (viz., ohmic contact) is established between the contact point of each of the pins 13 and the terminal surface irrespective of the amount of overdrive.

In this case the pins 13 can be formed of high tensile steel wire having a diameter of 60 μm or formed of a 60 μm thick high tensile steel plate which has been subject to photoengraving in a manner to define a plurality of pins. However, in the latter case, while the pins can be formed with increased precision the amount of preloading which can be achieved is reduced to about ⅔ of that possible with the pins which are formed from wire and which are subject to bending.

Figure 1:
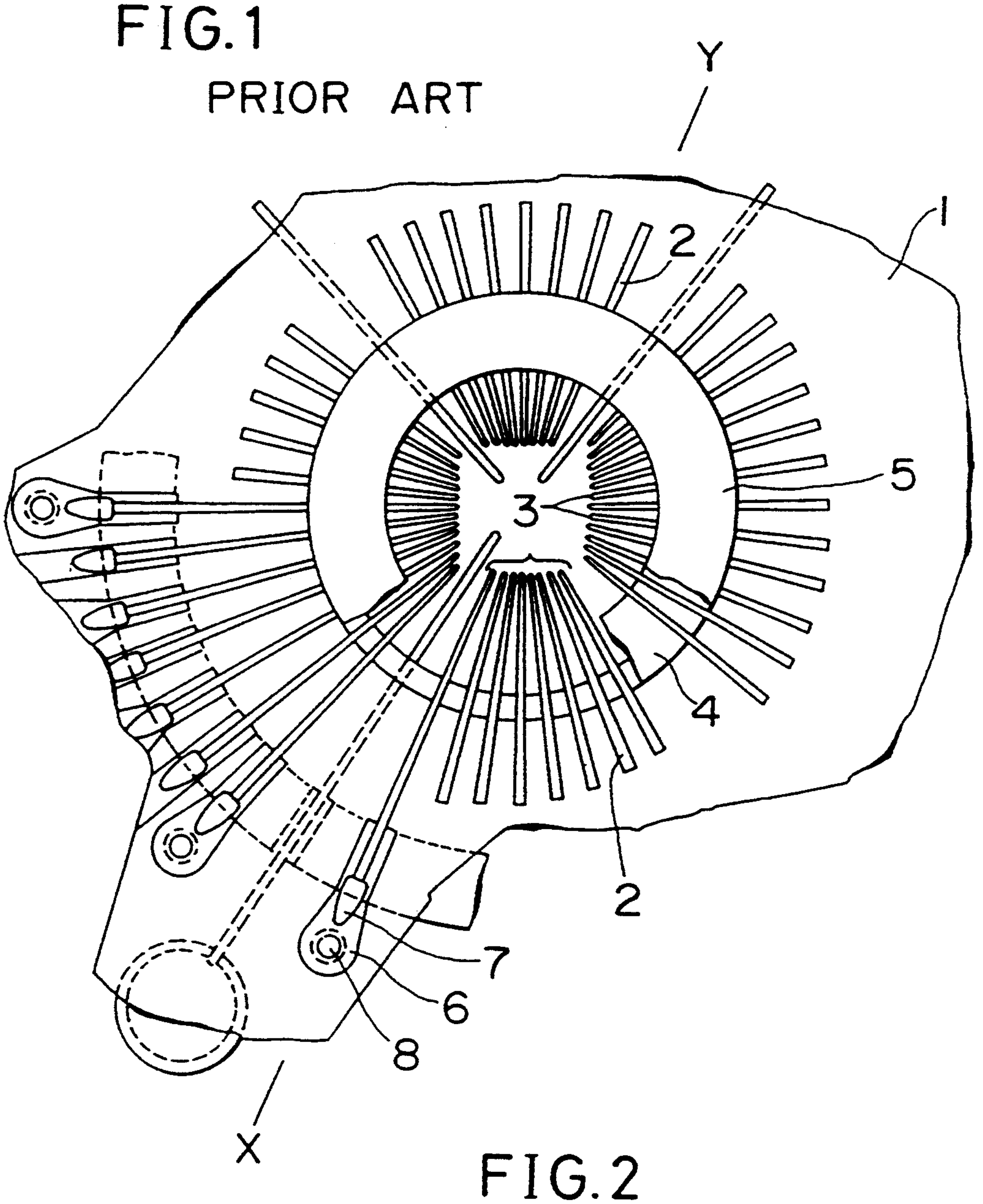
FIG. 1 is a partial plan view showing the conventional test probe assembly discussed in the opening paragraphs of the instant disclosure.
Figure 2:
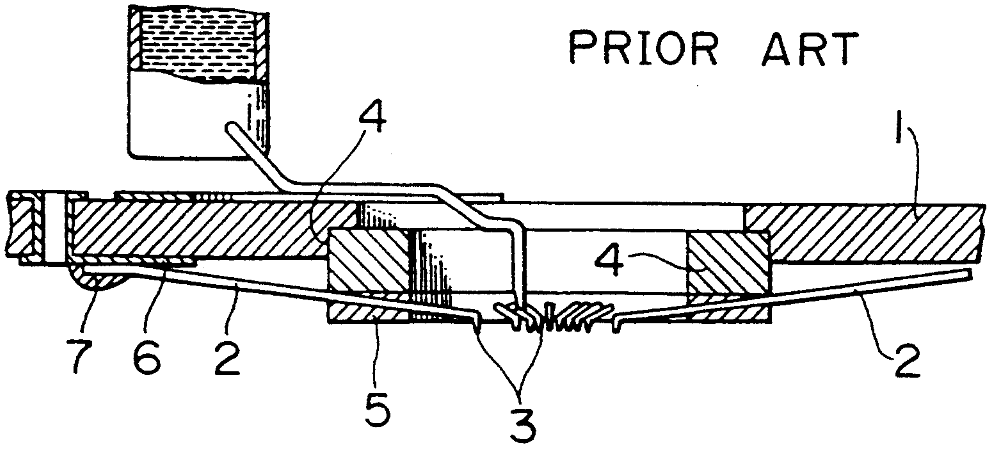
FIG. 2 is a cross-sectional view taken along section line X–Y in FIG. 1.
Figure 5:
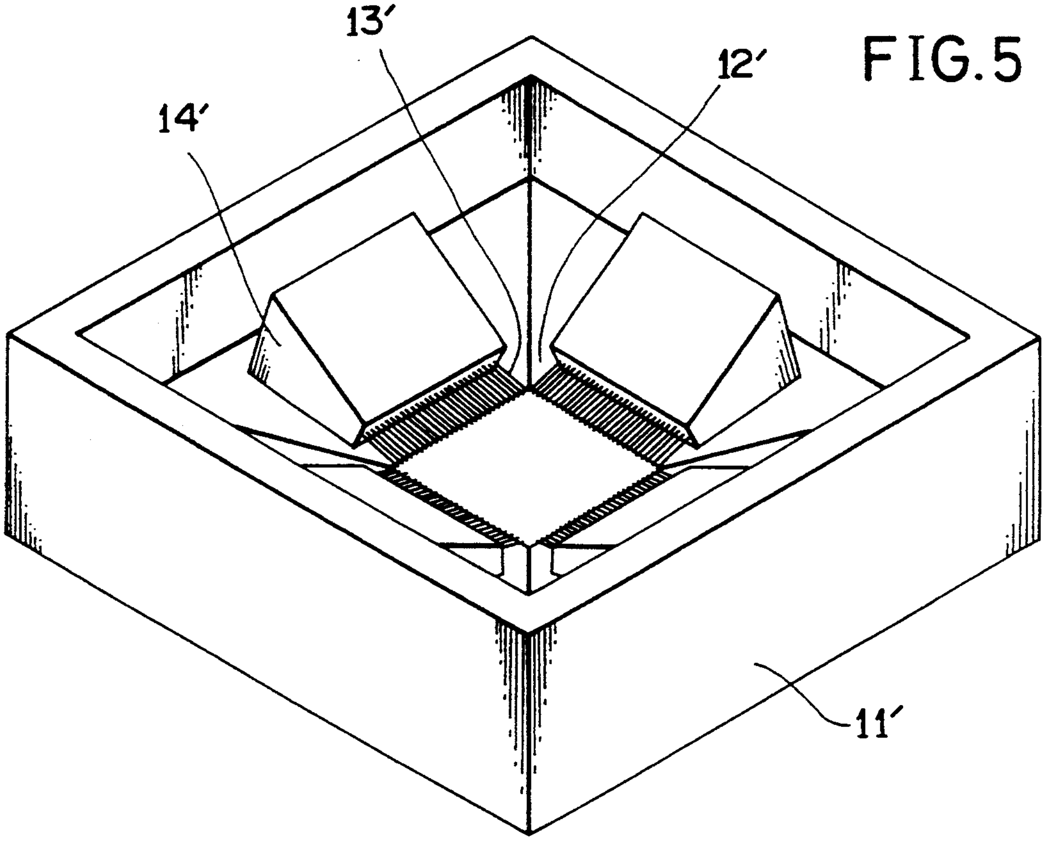
FIG. 5 is a perspective view showing a testing device which is equipped with four sets of probe arms or pins which are arranged in parallel and which are mounted and secured in accordance with a second embodiment of the present invention.

FIG. 5 is a perspective view showing a second embodiment of the present invention. In this arrangement the FPC clamp 16 and the pin clamp 15 of the first embodiment are formed as a single unit 14'. As will be appreciated from the drawing, four sets of pins are arranged along the four sides of a rectangular opening formed in a housing 11'. As in the first embodiment, each of the pins (denoted by 13') is arranged to have a leading end portion pressed down against the corresponding edge portion 12' around the rectangular opening. This configuration permits the number of pins to be increased as compared with the conical arrangement of the prior art shown in FIGS. 1 and 2.

It is of course within the scope of the present invention to utilize this parallel configuration with all of the embodiments disclosed in the instant specification.

Figure 6:
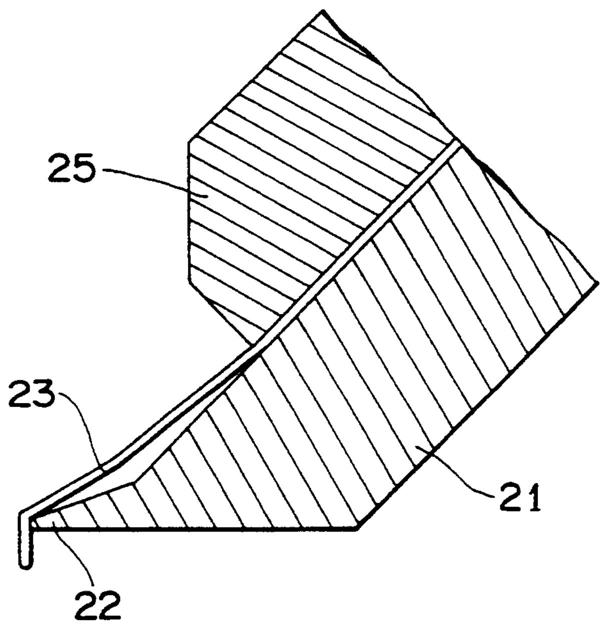
FIG. 6 is a sectional view showing a pin mounting arrangement according to a third embodiment of the present invention.

FIG. 6 shows a third embodiment of the present invention wherein pin support 21 formed of an alumina ceramic, is arranged to directly support each of the pins 23. The pins 23 are secured on the pin support 21 by a pin clamp 25. The support 21 is configured in such a manner as to have a support portion (viz., preload applying portion) 22 formed at the leading edge of the same which engages a leading portion of each pin 23 in a manner to induce a predetermined amount of elastic deformation and therefore preloading, in the same.

Although not shown in the figures, each of the support 21 and the support portion 22 is formed with a plurality of pin receiving grooves each of which are arranged at a pitch of about 140 μm. The pins are accommodated in these grooves.

In the third embodiment, in the case where the pins 23 are formed of high tensile steel wire having a diameter of 100 μm, a critical stress of 345 $kg/mm^2$ and an elastically deformable length of 3.0 mm, then the internal stress of the pins is 230 $kg/mm^2$ at zero overdrive. Further in such a case, at an overdrive of 100 μm the internal stress becomes equal to the critical stress viz., 345 $kg/mm^2$ wherein a contact pressure of 4 grams is obtained. The upper ends (not shown) of the pins 23 are connected with metallized lines (not shown) formed on the support 21.

Figure 7:
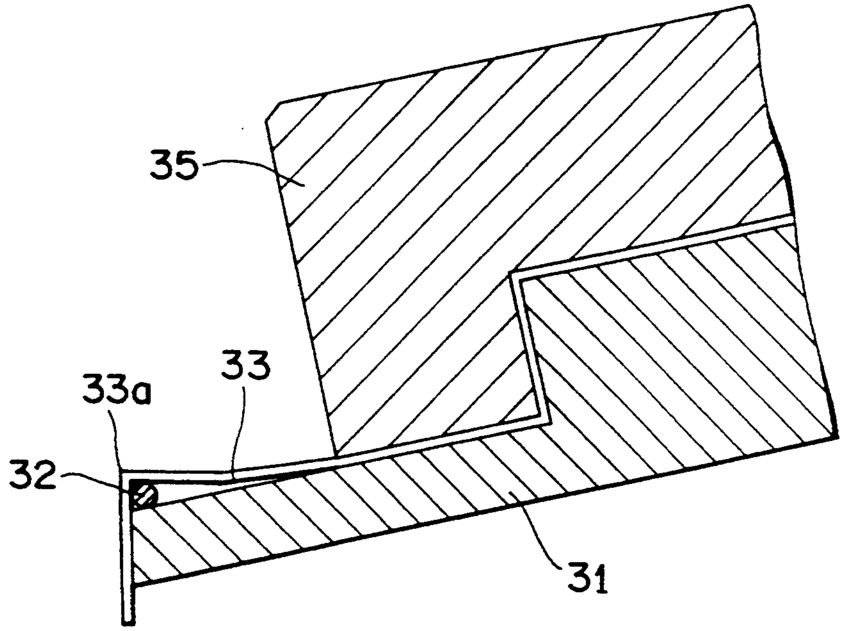
FIG. 7 is a sectional view showing the probe arm or probe pin arrangement which characterizes a fourth embodiment of the present invention.

FIG. 7 shows a fourth embodiment of the present invention. In this arrangement a pin support 31 is formed of acrylic resin and formed with pin receiving grooves (not shown) having a pitch of 100 μm. Each of pins 33 is made of high tensile steel wire having a diameter of 60 μm and accommodated within the corresponding groove. A sapphire rod 32 having a diameter of 250 μm is arranged along leading edge of the support 31 and arranged to support elbow portions 33*a* which are formed in the leading end portions of the pins 33 in a manner which induces a predetermined amount preloading in the same.

Each of the pins 33 has a crank-like stepped configuration of the shown. This configuration facilitates assembly. A pin clamp 35 which secures the pins 33 in the above mentioned grooves is also made of acrylic resin.

Figure 8:
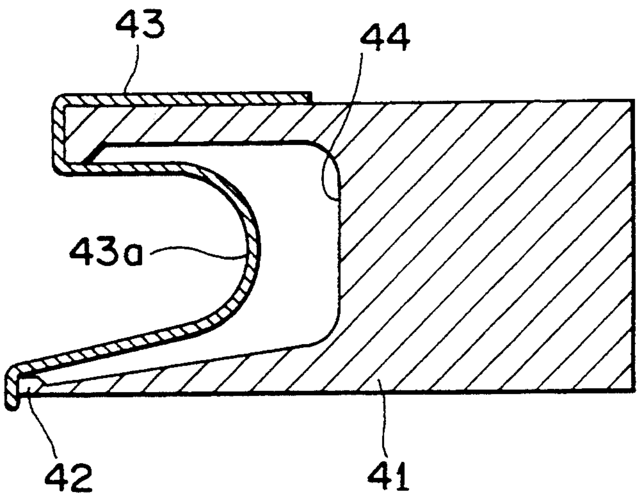
FIG. 8 is a sectional view showing a probe pin mounting arrangement according to a fifth embodiment of the present invention.

FIG. 8 shows a fifth embodiment of the invention. In this case a pin support 41 is formed of alumina ceramic which is formed with a plurality of parallel grooves (not shown) having a pitch of 100 μm. Each of pins 43 is formed of high tensile wire having a diameter of 60 μm and are received in the assigned groove. In order to enable a large pin stoke, the pins 43 are formed with a large diameter arcuately curved portion 43*a*. The support 41 is formed with a channel 44 which extends along the front of the same. As shown, the channel 44 is arranged to accommodate the arcuately curved portions of the pins 43.

The lower leading edge of the pin support 41 is formed with a support portion (or preloading applying portion) 42 which induces a preloading in the pins 43.

This embodiment enables easy assembly and the preloading of the pins 43 is readily achieved when the arcuately curved portions 43*a* of the pins 43 are inserted into the channel 44. The arcuately curved portions 43*a*, when the pins 43 are assembled, are bent beyond the critical stress until plastic deformation occurs. After being fully assembled the unit is subject to annealing. More specifically, annealing is implemented in vacuum heat treating furnace at 370° C. for 30 minutes.

Figure 9:
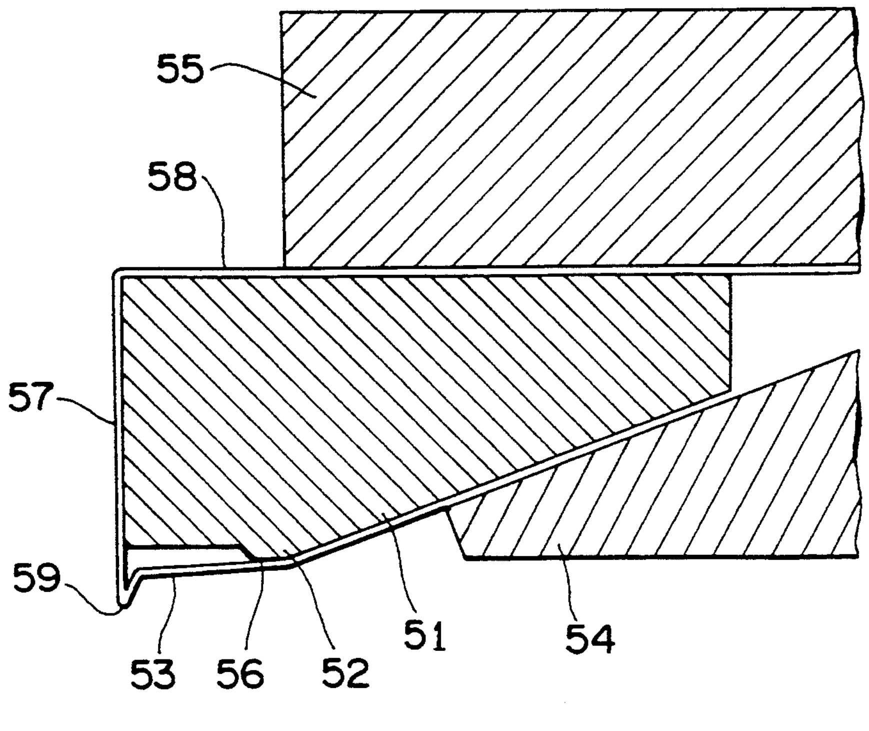
FIG. 9 is a sectional view showing the probe pin mounting arrangement which characterizes a sixth embodiment of the present invention.
Figure 10:
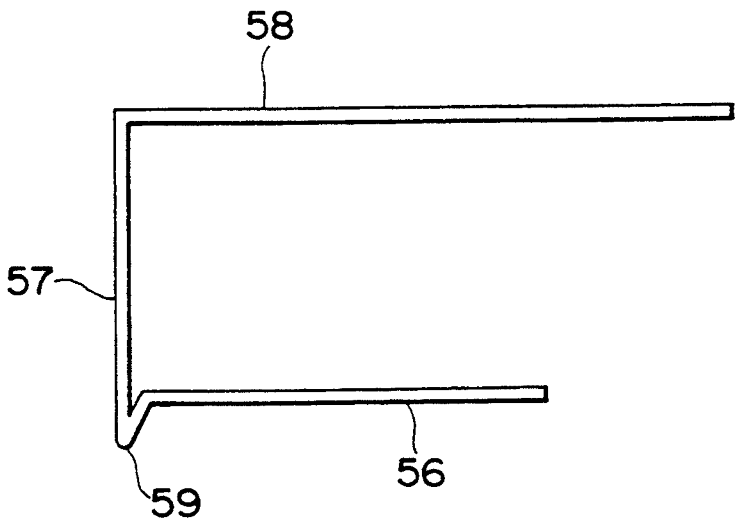
FIG. 10 is an elevation showing the configuration the probe arms or pins used in the sixth embodiment assume prior to assembly.

FIG. 9 shows a sixth embodiment of the present invention, while FIG. 10 shows the configuration of each of pins 53 prior assembly. As will be appreciated, each of the pins 53 is arranged to have a lower leg 56, a vertically extending portion 57 and an upper leg 58. A V-shaped contact point 59 is bent into the pin at the junction of the lower leg 56 and the vertically extending portion 57.

The feature of this embodiment comes in that, as different from the previous embodiments wherein only one end of each pin is clamped, in this instance both ends of the pin 53 are clamped as will be appreciated from FIG. 9. That is to say, the lower leg 56 is clamped against an angled lower surface of a pin support 51 by a lower pin clamp 54, while the upper leg 58 is clamped against the flat upper surface of the support 51 by an upper pin clamp 55.

With this embodiment, when the contact point 59 is pressed against the test surface by applying overdrive thereto, the movement of the contact point 59 away from the pin support 51 during overdrive which tends to occurs with the previous embodiments, is prevented.

It should be noted however, that scratching effect which tends to occur with the previous embodiments is, in the case wherein the pin is brought into contact with an aluminum pad on which an oxide layer has formed, actually such as to improve the electric connection. This is because the oxide layer is partially removed by the scatting effect. However, in the case wherein the pins are brought in contact with gold bumps, scratches of some depth are formed and tend to interfere with subsequent assembly operations and tends to increase the number of rejects.

Under these conditions the embodiment of FIG. 9 is such that lateral movement is prevented and thus highly suited for the testing wherein the pins 53 are pressed onto gold bumps.

As will be appreciated from FIG. 10, during assembly of the unit, the pins 53 are slipped onto the support 51 and the upper and lower pin clamps 55, 54 are brought into contact with the support 51 in a manner to sandwich the support 51 therebetween. This bends the lower leg 56 of the pin 53 about a support portion 52 and induces a preloading which tends to bias the contact point 59 downwardly.

The contact point 59 upon being brought into contact with the test piece is induced to move upwardly against the preloading and thus induce good contact.

With this embodiment even though the contact point 59 tends to be moved to the left as seen in the drawings, during testing, this tendency is obviated due to the rigid clamping of the upper and lower legs 58, 56 of the pins 53, and any scratch inducing horizontal displacement of the contact point 59 is reduced to a negligible level.

In this embodiment the pins are formed of high tensile steel wire having a diameter of 50 μm, a critical stress of 345 kg/mm$^2$ and provided with a 2 μm thick coating of Ni-Au. The unclamped and thus flexible, deformable length of the upper leg 58 is 1300 μm, the unclamped length of the lower leg 56 is 2600 μm, and the length between the pin point 59 and the support portion 52 has a length of 1300 μm. The vertically extending portion 57 has a length of 2500 μm. With these dimensions, the pin 53 produces a preload of 1.7 grams and a maximum internal stress of 174 kg/mm$^2$. When an overdrive of 100 μm is induced, a maximum internal stress becomes 244 kg/mm$^2$ and a contact pressure of 2.9 grams is developed.

In the case where each of the pins 53 is formed of 50 μm diameter of SUS wire (B grade), the critical stress of the pin becomes 245 kg/mm$^2$. In such a case, when an overdrive 100 μm is induced the maximum internal stress approaches the max of 245 kg/mm$^2$ and results in a contact pressure of 2.9 grams similar to the case of steel wire.

It should be noted that contact pressure variation between pins can be attenuated by overdriving until the critical stress is approached. Under these conditions the pin to pin difference in contact pressure minimizes.

Figure 11:
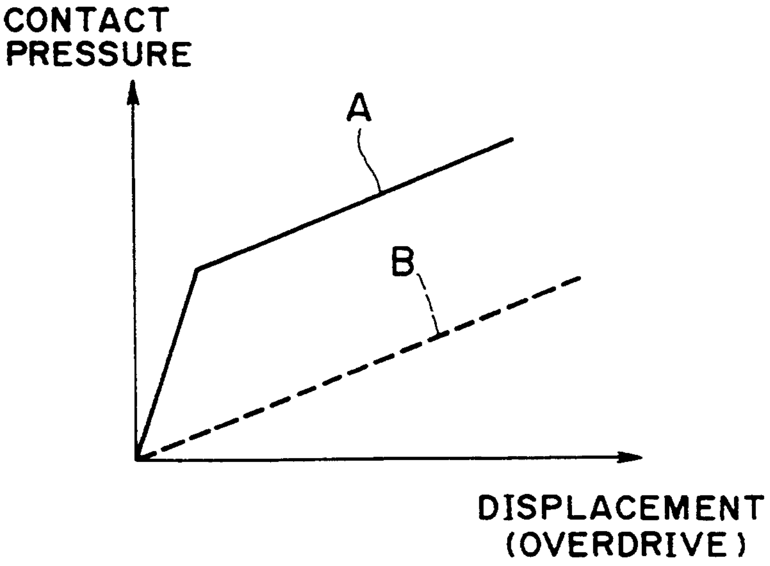
FIG. 11 is a graph which compares, in terms of contact pressure and overdrive displacement, the contact pressure characteristics which are derived with the present invention with those derived with the prior art shown in FIGS. 1 and 2.

FIG. 11 shows the relationship between the contact pressure and the amount of overdrive in connection with the preloading is applied (denoted by a solid line A) and the preloading is not applied (denoted by a broken line B). As will be appreciated, with the invention, due to the preloading of the pins, the amount of contact pressure increases very rapidly during the initial stages of overdrive and reaches a value not obtained with the prior art even at maximum overdrive values.

While the foregoing description describes six embodiments according to the present invention, the various alternatives and modifications possible without departing from the scope of the present invention, which is limited only by the appended claims, will be apparent to those skilled in the art.

What is claimed is

1. A multi-point test probe assembly comprising a pin support;

a pin having first and second end portions with said first end portion of said pin being fixedly secured to said pin support and said second end portion of said pin including a contact portion for use in contacting a test surface, said pin support engaging said second end portion of said pin so as to deflect said second portion of the pin and induce a preload to the pin which biases said contact portion in a direction which is opposite to a direction along which said pin is to be brought into contact with the test surface and;

a rod which is disposed along a leading edge of said pin support, said second end portion having an angled end portion which extends downwardly at the leading edge of said pin support.

2. A multi-point test probe assembly comprising a pin support having an upper surface, a lower surface and an essentially vertical surface interconnecting said upper and lower surfaces;

a first clamp member;

a second clamp member; and a pin defining a contact portion for use in contacting a test surface, said pin including a first leg portion which is secured to said upper surface by said first clamp and a second leg portion which is secured to said lower surface by said second clamp, said pin further including a connecting portion which extends between said first leg portion and said second leg portion and which lies on said essentially vertical surface, said contact portion of said pin being defined between said second leg portion of said pin and said connecting portion of said pin, said pin support having a projection formed on said lower surface for deflecting the contact portion of said pin and inducing a preload to the pin which biases said contact portion in a direction which is opposite to a direction along which said pin is to be brought into contact with the test surface.

* * * * *